United States Patent [19]
Horiuchi et al.

[11] Patent Number: 6,084,295
[45] Date of Patent: Jul. 4, 2000

[54] SEMICONDUCTOR DEVICE AND CIRCUIT BOARD USED THEREIN

[75] Inventors: Michio Horiuchi, Nagano; Hidemi Akada, Minamiazumi-gun, both of Japan

[73] Assignee: Shinko Electric Industries Co., Ltd., Nagano, Japan

[21] Appl. No.: 09/148,330

[22] Filed: Sep. 4, 1998

[30] Foreign Application Priority Data

Sep. 8, 1997 [JP] Japan ................................. 9-242295

[51] Int. Cl.⁷ ........................................... H01L 23/48
[52] U.S. Cl. ............................ 257/690; 257/738; 257/784
[58] Field of Search ................................. 257/738, 659, 257/700, 784, 690

[56] References Cited

U.S. PATENT DOCUMENTS

| | | | |
|---|---|---|---|
| 5,396,104 | 3/1995 | Kimura | 257/784 |
| 5,625,222 | 4/1997 | Yoneda et al. | 257/687 |
| 5,640,047 | 6/1997 | Nakashima | 257/738 |
| 5,640,048 | 6/1997 | Selna | 257/738 |
| 5,656,857 | 8/1997 | Kishita | 257/690 |
| 5,767,447 | 6/1998 | Dudderar et al. | 174/52.4 |

FOREIGN PATENT DOCUMENTS 63-146453  6/1988  Japan .
4-15942    1/1992  Japan .

*Primary Examiner*—Michael Trinh
*Assistant Examiner*—Roy Potter
*Attorney, Agent, or Firm*—Staas & Halsey LLP

[57] ABSTRACT

A semiconductor chip having electrode terminals arranged in an area-array manner is mounted on an upper surface of a first region of a circuit board. Bonding pads are provided on the upper surface of a second, different region of the circuit board, and are connected to electrode terminals on the upper surface of the chip with bonding wires covered with an electro-insulation coating. External connection terminals provided on an opposing surface of the second region of the circuit board in an area-array manner are electrically connected to the bonding pads by conductive vias provided through the circuit board in the thickness direction. An electro-insulation film covers the chip, including the bonding wire/electrode terminal connections, and the upper surface of the second region of the circuit board. An electro-conductive resin encapsulates the coated bonding wires and the electro-insulation film.

13 Claims, 5 Drawing Sheets

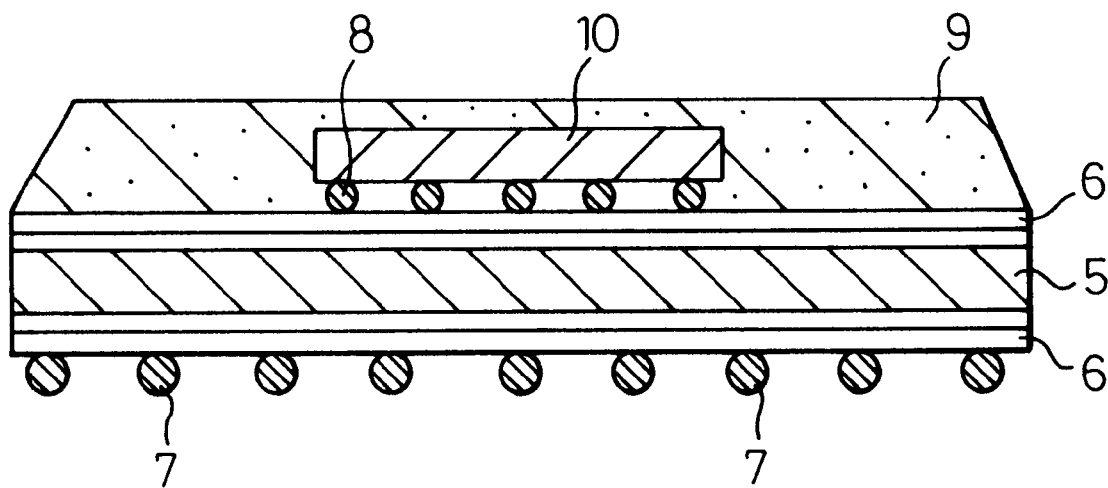

SEMICONDUCTOR DEVICE AND CIRCUIT BOARD USED THEREIN

BACKGROUND OF THE INVENTION

1. Field of the Invention

The present invention relates to a semiconductor device carrying a semiconductor chip and a circuit board advantageously used in such a device.

2. Description of the Related Art

A semiconductor chip carried on a semiconductor device has electrode terminals of which the number has recently increased because of the number of functions added to the semiconductor device. Accordingly, a method has often been used wherein the electrode terminals are formed on an electrode terminal-forming surface of the semiconductor chip in an "area-array" manner, and the semiconductor chip is mounted onto the circuit board by a flip-chip connection. According to the flip-chip connection, bumps formed on the electrode terminals are bonded to pads of the circuit board to electrically connect the electrode terminals with external connection terminals provided on the circuit board.

FIG. 10 illustrates a conventional semiconductor device comprising a semiconductor chip 10 mounted on a circuit board 5 and having electrode terminals 8 arranged in an area-array manner. Reference numeral 6 denotes a build-up layer formed on each of opposite sides of the circuit board 5, and 7 denotes an external connection terminal. The semiconductor chip 10 is electrically connected to a circuit pattern (not shown) provided in the build-up layer 6 and electrically connected to the external connection terminal 7. The build-up layer 6 is formed as a multi-layered structure for the purpose of forming circuit patterns for electrically connecting electrode terminals 8 of the semiconductor chip with external terminals. Reference numeral 9 denotes a resin for shielding the semiconductor chip 10.

The build-up layer 6 is formed of electro-insulation substrates, for example, of epoxy or polyimide, each of which carries a circuit pattern and is sequentially added while electrically connecting the circuit patterns with each other. Therefore, there are drawbacks in this arrangement in that, although it is suitable for a high-density wiring, a multi-layered structure is difficult to assuredly obtain, the manufacturing cost is high, the reliability is low, and the yield is low.

SUMMARY OF THE INVENTION

An object of the present invention is to provide a semiconductor device which does not need high-density wiring such as a build-up layer and can be easily manufactured at a low cost as well as having excellent reliability and electrical properties.

Another object of the present invention is to provide a circuit board which can be advantageously employed in a semiconductor device such as that mentioned above.

According to one aspect of the present invention, there is provided a semiconductor device comprising: a circuit board having a first surface and a second surface opposite to the first surface; a semiconductor chip having a first surface on which electrode terminals are arranged in an area-array manner and on a second surface opposite to the first surface, the semiconductor chip being mounted on the circuit board in such a manner that the second surface of the semiconductor chip is in contact with the first surface of the circuit board; a plurality of bonding pads is arranged on the first surface of the circuit board except for an area on which the semiconductor chip is mounted; a plurality of bonding wires, each comprising a conductive wire and an electro-insulation coating the conductive wire, for electrically connecting the electrode terminals to the bonding pads; and external connecting terminals arranged on the second surface of the circuit board in an area-array manner, the external connecting terminals being electrically connected to the bonding pads by conductive vias provided through the thickness direction of the circuit board.

The connecting portions between the bonding wires and the electrode terminals and connecting portions between the bonding wires and the bonding pads are coated with an electro-insulation film.

The semiconductor chip and the first surface of the circuit board including the bonding wires are sealed with an electro-conductive resin.

The electric potential of the electro-conductive resin is set at ground level.

The circuit board is provided with thermal vias in a region on which the semiconductor chip is mounted.

According to another aspect of the present invention, there is provided a semiconductor device comprising: a circuit board having a first surface and a second surface opposite to the first surface; a semiconductor chip having a first surface on which electrode terminals are arranged in an area-array manner and a second surface opposite to the first surface, the semiconductor chip being mounted on the circuit board in such a manner that the second surface of the semiconductor chip is in contact with the first surface of the circuit board; a plurality of conductive vias arranged in an area-array manner and extend through a thickness direction of the circuit board, the vias being exposed approximately at the first surface of the circuit board to define a plurality of bonding pads; a plurality of bonding wires, each comprising a conducive wire and an electro-insulation coating the conductive wire, for electrically connecting the electrode terminals to the bonding pads; and external connecting terminals attached to the conductive vias at the second surface of the circuit board.

The conductive vias extend over the second surface of the circuit board to define the external terminals by the conductive vias perse.

The circuit board has ground layers surrounding the respective conductive vias by means of electro-insulation layers.

Each of the ground layers is annular-shaped to surround each of the conductive vias by an annular electro-insulation layer.

The ground layers are arranged in a grid-shaped manner to surround each of the conductive vias by electro-insulation layers.

According to still another aspect of the present invention, there is provided a circuit board comprising: a substrate having a first surface and a second surface opposite to the first surface; a plurality of conductive vias arranged in an area-array manner and extending through a thickness direction of the substrate, the conductive vias being exposed approximately at the first surface to define a plurality of bonding pads; and external connecting terminals attached to the conductive vias at the second surface.

BRIEF DESCRIPTION OF THE DRAWINGS

The present invention will be described in more detail below with reference to the preferred embodiments illustrated in the attached drawings, wherein

FIG. 10 is a side sectional view of a conventional semiconductor device carrying a semiconductor chip on a circuit board.

DETAILED DESCRIPTION OF THE EMBODIMENTS

Figure 1:
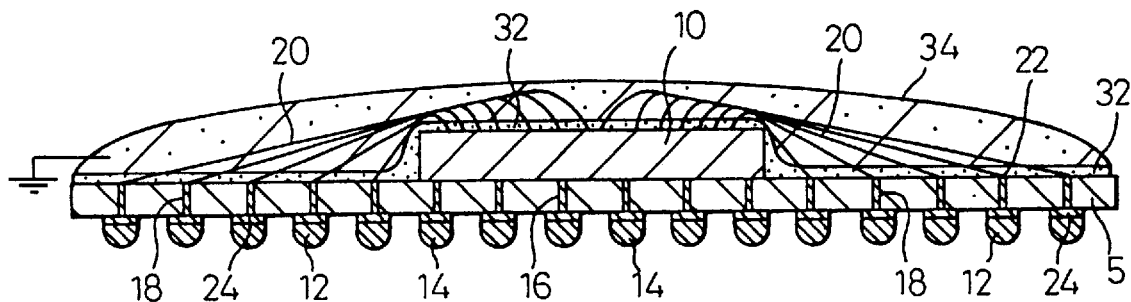
FIG. 1 is a side sectional view of one embodiment of a semiconductor device according to the present invention.

FIG. 1 is a side sectional view of one embodiment of a semiconductor device according to the present invention. The semiconductor device of this embodiment carries a semiconductor chip 10 on one surface of a substrate or circuit board 5, while the semiconductor chip is upside down. The semiconductor chip 10 is electrically connected to external connection terminals 12 provided on the other surface of the circuit board 5 via bonding wires 20.

The external connection terminals 12 are arranged in an "area-array" manner, and bonding pads 22 are arranged on a surface of the circuit board 5 carrying the semiconductor chip 10 in the same pattern as that of the external connection terminals 12.

The bonding wire 20 directly connects an electrode terminal of the semiconductor chip 10 with the bonding pad 22. While the conventional wire bonding is applied to a bonding section provided at one end of a circuit pattern, the wire bonding according to the present invention is directly, not via the circuit pattern, applied to the bonding pad 22 connected to the external connection terminal 12.

Figure 2:
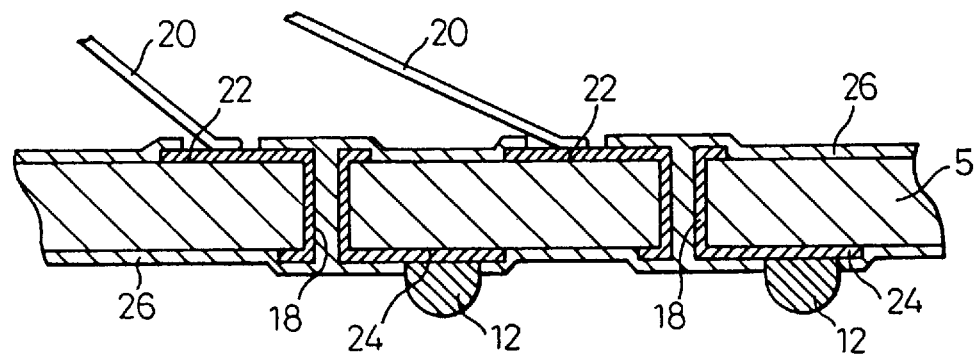
FIG. 2 is an enlarged side sectional view of one circuit board structure, illustrating a bonding section of a bonding wire.

FIG. 2 shows a connecting section between the bonding wire 20 and the bonding pad 22 and the external connection terminal 12 in an enlarged scale. The circuit board 5 used in this embodiment is mainly formed of a resinous substrate, and is provided on a surface carrying the semiconductor chip 10 with bonding pads 22 to which the bonding wires 20 are bonded, and on the other surface to which the external connection terminals 12 are secured with lands 24. The bonding pads 22 and the lands 24 are formed at a predetermined arrangement by etching a conductor layer such as a copper foil formed on a surface of the resinous substrate.

The bonding pad 22 and the land 24 are electrically connected to each other through a via 18. According to this embodiment, through-holes are provided in the resinous substrate which is then plated with conductive metal such as copper to form the via 18. Since it is impossible to form the bonding pad 22 and the land 24 at the through-hole, they are provided on the peripheral edge of the via 18 while being electrically connected to the via 18. A protective coating 26, such as solder resist, covers all over the surface of the circuit board 5 except for the bonding pads 22 and the lands 24 to provide a connecting section. The bonding pad 22 and the land 24 are exposed in circular shapes approximately 300 and 500 μm in diameter, respectively.

The bonding pad 22 and the land 24 are disposed on one and the other surface of the circuit board 5, respectively, in a one-to-one correspondence through the via 18 as shown in FIG. 2, without any connection circuit patterns between the two except for the via 18.

Accordingly, if the semiconductor chip 10 is connected to the bonding pad 22 by the bonding wire 20 as described before, it is possible to connect the semiconductor chip 10 to the bonding pad 22 and the external connection terminal 12 without any intermediate wiring circuit patterns.

The direct connection of the electrode terminal of the semiconductor chip 10 to the bonding pad 22 by the bonding wire 20 may cause a risk of short-circuit accident due to a mutual contact between bonding wires 20 because the electrode terminals of the semiconductor chip 10 and the bonding pads 22 are arranged in an area-array manner at a relatively high density. To avoid such an inconvenience, according to the present invention, an insulated wire formed by covering a conventionally used wire of gold, copper or aluminum with an electro-insulation coating is used for the wire bonding.

Figure 3:
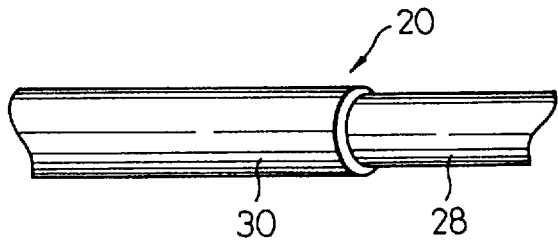
FIG. 3 is an enlarged perspective view of a bonding wire.

FIG. 3 illustrates, in an enlarged scale, a bonding wire 20 formed of a gold wire 28 covered with an electro-insulation coating 30. The gold wire 28 has a diameter of approximately 35 μm, and the electro-insulation coating 30 has a thickness of approximately 5 μm. The electro-insulation coating 30 may be resinous film of, for example, an epoxy type.

By using the bonding wire 20 covered with the electro-insulation coating 30, it is possible to prevent the short-circuit accident from occurring even though the bonding wire 20 is brought into contact with another during the wire bonding.

In this regard, during the bonding operation while using the insulated wire covered with the electro-insulation coating 30, the conductor wire (gold wire 28) itself must be bonded to the connecting section. That is, when the insulated wire is used, the conductor wire (gold wire 28) must be exposed from the insulation coating 30 before being bonded to the connecting section. For bonding the conductor wire while removing the electro-insulation coating 30, an excimer laser may be used for removing the coating.

When the bonding is carried out while using the insulated wire covered with the electro-insulation coating 30, the conductor wire (gold wire 28) is exposed in the connecting section between the electrode terminal of the semiconductor chip 10 and the bonding wire 20 and in the connecting section between the bonding pad 22 and the bonding wire 20. Accordingly, it is necessary to cover these exposed portions by thinly coating electro-insulating resin thereon. In FIG. 1, reference numeral 32 denotes a resin coating covering the exposed portions in the connecting section.

In this embodiment, when the resin coating 32 is applied, not only the bonding section but also lateral side areas of the semiconductor chip 10 are coated to shield the semiconductor device as a whole including the semiconductor chip 10, the circuit board 5 and the bonding wires 20 from the outside. This device could be used as a semiconductor device at this stage wherein the resin coating 32 has been applied.

Figure 4:
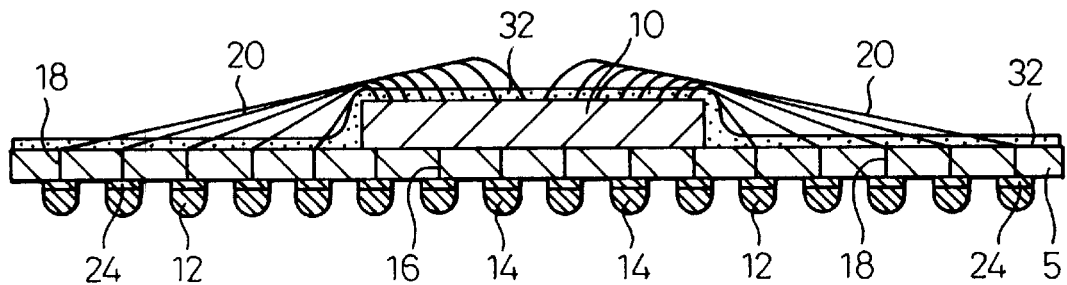
FIG. 4 is a side sectional view of another embodiment of a semiconductor device according to the present invention.

FIG. 4 illustrates a state wherein, after the wire bonding has been carried out, the bonding section between the bonding wires 20 and the bonding pads 22 and the bonding section between the electrode terminals of the semiconductor chip 10 and the bonding wires 20 are shielded with the resin coating 32, while solder balls are secured, as external connection terminals 12, to the lands 24 provided on the lower surface of the circuit board 5. Reference numeral 14 denotes thermal bumps for heat dissipation from the semiconductor chip 10. The thermal bump 14 is connected to a thermal via 16 provided in the area of the circuit board 5 to which the semiconductor chip 10 is mounted, and is used for facilitating heat dissipation from the semiconductor chip 10.

The device according to this embodiment may be used as it is, as a semiconductor device, after being mounted onto a large-sized circuit board.

In the embodiment shown in FIG. 1, all of the semiconductor chip 10 and the bonding wires 20 are shielded with electro-conductive resin 34 on one surface of the circuit board 5, after the bonding sections of the bonding wires 20 have been shielded with the resin coating 32. The electro-conductive resin 34 having a good thermal conductivity used as a shield enhances the heat dissipation from the semiconductor chip 10, thereby enabling the semiconductor chip 10 of large heat generation to be easily mounted and causes the respective bonding wires 20 to constitute a coaxial cable line if the electro-conductive resin 34 is set at a ground potential, thereby improving the electrical characteristic of the device for signals transmitted through the bonding wires 20.

In the case wherein the electro-conductive resin 34 is set at the ground potential so that the respective bonding wires 20 operate as a coaxial cable line, it is also possible to make the impedance-matching as a signal line by the selection of material (dielectric constant) and/or thickness of the resin coating 32 covering the conductive wire.

The electro-conductive resin 34 may be, for example, a paste of epoxy resin containing a silver filler of lower viscosity, which is capable of easily shielding the semiconductor chip 10 by a potting method. Since the bonding wire 20 is covered with the electro-insulation coating 30, and the bonding section between the bonding wires 20 and the electrode terminals and the bonding section between the bonding wires 20 and the bonding pads 22 are all covered with the electro-insulation resin coating 32, there is no risk of short-circuit between the bonding wires 20 even though they are shielded with the electro-conductive resin 34.

The semiconductor device of the above-mentioned embodiment is characterized in that the electrode terminals of the semiconductor chip 10 arranged in an area-array manner are directly connected via the bonding wires 20 to the bonding pads 22 arranged on the upper surface of the circuit board 5, in an area-array manner, except for a part on which the semiconductor chip 10 is mounted. According to this feature, it is possible to effectively reduce the wire length for electrically connecting the semiconductor chip 10 to the external connection terminal 12. For example, the wire length can be reduced to approximately 20 mm instead of approximately 50 mm in the prior art semiconductor device using the conventional build-up substrate. The reduction of wire length also reduces the inductance of the wiring to improve the electrical characteristics of the device.

The circuit board 5 of the semiconductive device according to this embodiment has a structure, wherein the bonding pads 22 are provided on one surface thereof and the lands 24 are provided on the other surface, which needs no build-up layer for arranging the detour wiring thereon and therefore simplifies the constitution of the circuit board 5. Thus, it is possible to produce the circuit board 5 at a lower cost and improve the yield thereof.

Figure 5:
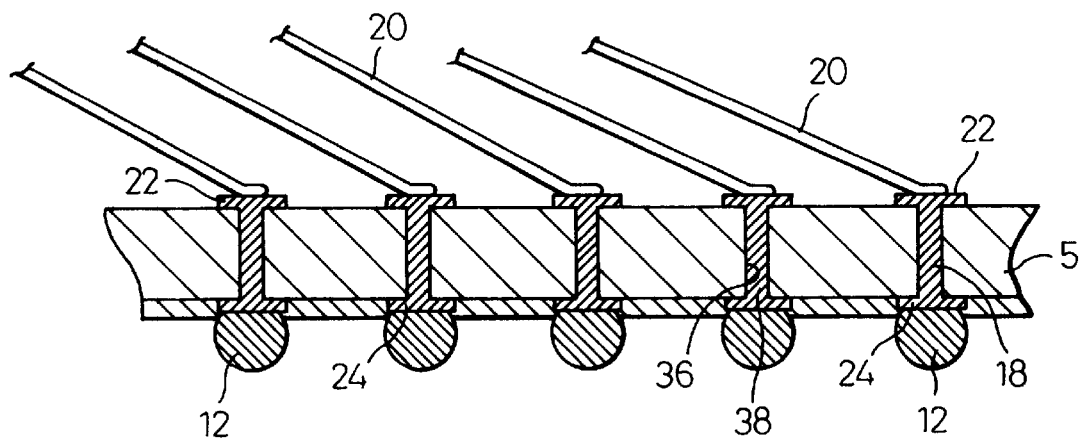
FIG. 5 is a side sectional view of another circuit board structure.

FIG. 5 shows a further embodiment of a circuit board 5 used in a semiconductor device according to the present invention, mainly composed of a ceramic substrate. In this circuit board 5, via-holes 36 are provided in the ceramic substrate and filled with conductive paste 38 to form vias 18. Since the via 18 is completely filled with the conductive paste 38 in this embodiment, it is possible to provide a bonding pad 22 and a land 24 at the same position as the via 18; i.e., directly above and beneath the via 18.

Also in this embodiment, the bonding wire 20 extends from the semiconductor chip 10 directly to the bonding pad 22, whereby the semiconductor chip 10 can be electrically connected to the external connection terminal 12 without using any detour wiring. In the same manner as the above-mentioned embodiment, a resin coating 32 covers the bonding section and an electro-conductive resin 34 is used for shielding.

Figure 6:
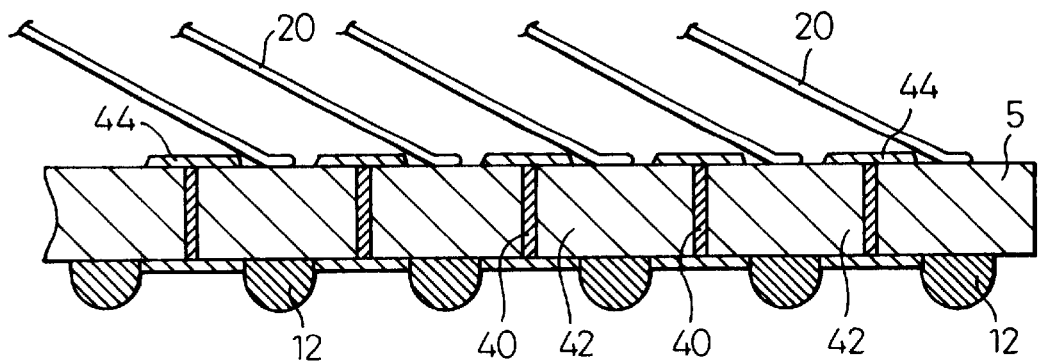
FIG. 6 is a side sectional view of further circuit board structure.

FIG. 6 illustrates an additional embodiment wherein conductive substrate of metal, for example, is used for a circuit board 5. In this drawing, reference numeral 40 denotes insulation walls for partitioning the conductive substrate at a pitch into a grid-like sections, each being electrically insulated from the other. The circuit board 5 is constituted as a single-piece plate from conductor portions 42 partitioned in a grid-like configuration and the insulation walls 40. Each of the conductor portions 42 corresponds to the via 18 in each of the above-mentioned embodiments. It is possible to electrically connect the semiconductor chip 10 to the external connection terminal 12 solely with the bonding wire 20, by bonding the bonding wire 20 to one exposed surface of the conductor portion 42 and securing the external connection terminal 12 on the other exposed surface of the conductor portion.

According to this embodiment, the one surface of the conductor portion 42 corresponds to the bonding pad 22 in the preceding embodiment, and the other surface thereof corresponds to the land 24. In such a manner, the conduction between the bonding pad 22 and the land 24 is not limited to the via 18 but may be any other manner means for electrically connecting opposite surfaces of the circuit board 5 with each other in the thickness direction.

In the embodiment shown in FIG. 6, a protective coating 44 is provided on a surface to be connected to the bonding wire 20 so that a position to be bonded to the bonding wire 20 is solely exposed outside. As described before, since there is a case wherein the bonding section of the bonding wire 20 is covered with the resin coating 32, the protective coating 44 is not necessarily provided.

In the circuit board 5 having the conductor portions 42 arranged in a grid-like manner used in the embodiment shown in FIG. 6, the arrangement pitch of the conductor portions 42 is preferably selected to be a small value, to some extent, because such a circuit board 5 is usable for mounting different types of semiconductor chips 10 by selecting the conductor portions 42 disposed at proper positions.

Figure 7A:
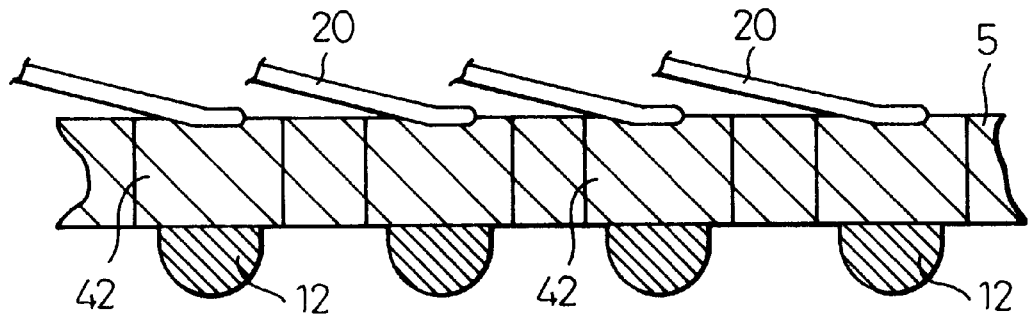
FIGS. 7(a) to 7(c) are side sectional views of further more circuit board structures, respectively.

In FIGS. 7(*a*) to 7(*c*), some variations of the circuit board structures are shown.

In the embodiment shown in FIG. 7(*a*), an insulation substrate 5 has an upper surface and a lower surface opposite to the upper surface. A plurality of vias 42 filled with conductive paste is regularly arranged in an area-array manner. Each of the conductive vias 42 extends through a thickness direction of the substrate 5 and is exposed approximately at the upper and lower surfaces, respectively, to define a bonding pad to which the respective bonding wire 20 is connected and a lower end to which an external connecting terminal, such as solder ball 12, is attached, respectively.

Figure 7B:
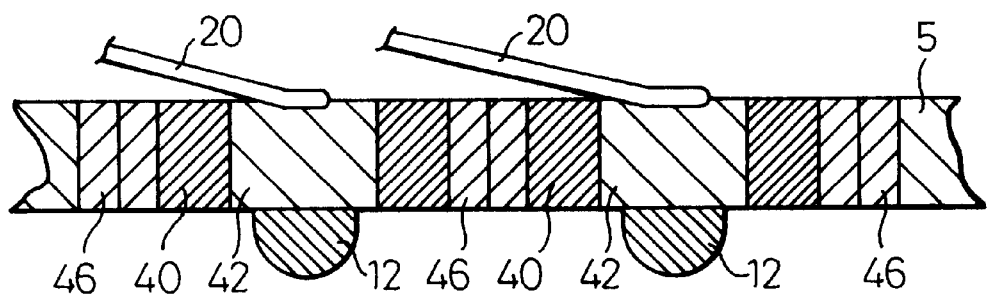
Figure 8:
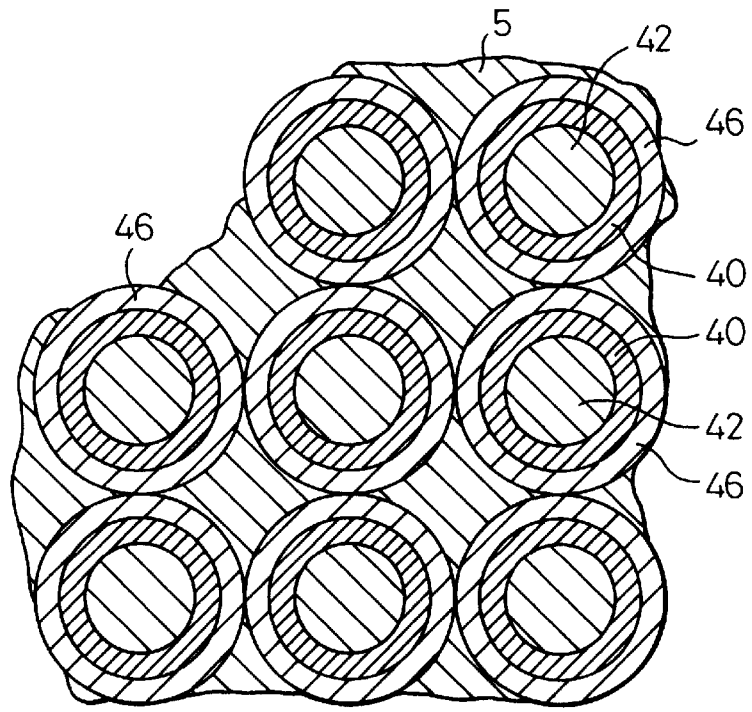
FIG. 8 is a plan view of the circuit board shown in FIG. 7(b)
Figure 9:
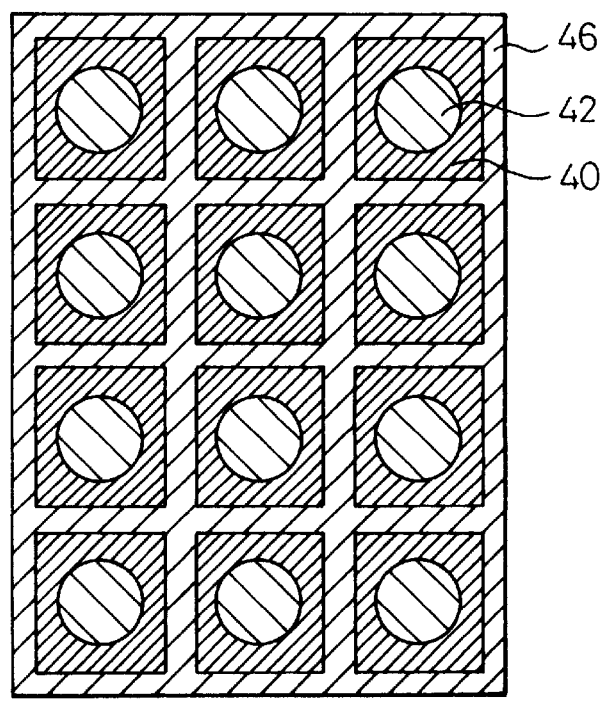
FIG. 9 is a plan view of a modification of the circuit board shown in FIG. 8.

In FIG. 7(b), there are ground layers 46 extending through a thickness direction of the substrate 5 and surrounding the respective conductive vias 42 by electro-insulation layers 40. The conductive vias 42, the electro-insulation layers 40 and the ground layers 46 are arranged in such a manner as shown in FIG. 8. That is to say, each of the ground layers 46 is annular-shaped to surround each of the conductive vias 42 by an annular electro-insulation layer 40. It is also possible that the ground layers 46 are arranged in a grid-shaped manner to surround each of these conductive via 42 by electro-insulation layers 40, as shown in FIG. 9.

The circuit board shown in FIG. 7(b) can be applied to the embodiment of a semiconductor device shown in FIG. 1, i.e., in place of the circuit board 5 of FIG. 1. Since the via structure of the circuit board of FIG. 7(b) a coaxial type so that, when the bonding wires 20 are connected to the conductive vias 42, the connection including the bonding wire 20 and the conductive via 42 for electrically connecting the electrode terminal of the semiconductor chip 10 to the external terminals 12 is possible to function as a coaxial structure along the substantially whole length thereof. Therefore, an electrical characteristic with respect to the electric signals transmitting through such a connection is can improved as compared with the corresponding electrical connection of the semiconductor device shown in FIG. 1.

In the circuit board shown in FIG. 7(b), it should be noted that the ground vias or layers 46 are in contact with one another, i.e., with the adjacent ground vias 46, so that all of the ground vias 46 are maintained at the same electrical potential of the ground level.

Figure 7C:
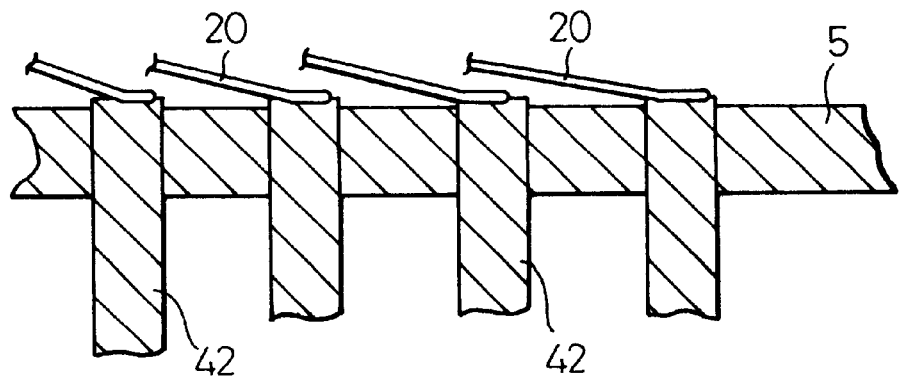

In the embodiment in FIG. 7(c), each of the conductive vias 42 is exposed approximately at the upper surface of the substrate 5 to define a connecting pad. However, each of the conductive vias 42 extends over the lower surface of the substrate 5 to define an external connecting terminal by itself.

According to the semiconductor device and the circuit board of the present invention, as described above, since it has a structure wherein the electrode terminals of the semiconductor chip arranged in an area-array manner are bonded to the bonding pads of the circuit board, which are also arranged in an area-array manner, with bonding wires, each covered with an insulation coating, it is possible to simplify the constitution of the circuit board, to save the production cost and to improve the yield thereof. Also, since a length of wiring for manufacturing the semiconductor device is reduced, the semiconductor device excellent in electrical characteristic is obtainable. By shielding the semiconductor chip and the bonding wires with electro-conductive resin, the resultant device is excellent in heat-dissipation. If the electro-conductive resin is set at a ground potential, the device is improved in processing a high speed signal.

It should be understood by those skilled in the art that the foregoing description relates to only a preferred embodiment of the disclosed invention, and that various changes and modifications may be made to the invention without departing from the spirit and scope thereof.

What is claimed is:

1. A semiconductor device, comprising:
    a circuit board having a first surface, a second surface opposite to said first surface, a first region for receiving a semiconductor chip, and a second different region for receiving external connecting terminals;
    a semiconductor chip having a first surface on which electrode terminals are arranged in an area-array manner and a second surface opposite to said first surface, said semiconductor chip being mounted on said circuit board in such a manner that said second surface of the semiconductor chip is in abutting contact with said first surface at the first region of the circuit board;
    a plurality of bonding pads arranged on said first surface of the circuit board at said second region;
    a plurality of bonding wires, each including a conductive wire and an electro-insulating coating for covering said conductive wire, for electrically connecting said electrode terminals of the chip to said bonding pads; and
    external connecting terminals arranged on said second surface of the circuit board in an area-array manner at the second region, said external connecting terminals being electrically connected to said bonding pads by conductive vias provided through a thickness direction of said circuit board,
    wherein connecting portions between said bonding wires and said electrode terminals, and connecting portions between said bonding wires and said bonding pads, are coated with an electro-insulation film,
    wherein said semiconductor chip, said first surface of the second region of the circuit board, and said bonding wires, are encapsulated by an electro-conductive resin, and
    wherein an electric potential of said electro-conductive resin is set at ground level.

2. A semiconductor device as set forth in claim 1, wherein said circuit board is provided with thermal vias in said first region which directly contact the chip.

3. A semiconductor device, comprising:
    a circuit board having a first surface, a second surface opposite to said first surface, a first region for receiving a semiconductor chip, and a second, different region for receiving external connecting terminals;
    a semiconductor chip having a first surface on which electrode terminals are arranged in an area-array manner and a second surface opposite to said first surface, said semiconductor chip being mounted on said circuit board in such a manner that said second surface of the semiconductor chip is in abutting contact with said first surface at the first region of the circuit board;
    a plurality of conductive vias arranged in an area-array manner in said second region, and extending through a thickness direction of said circuit board, said vias being exposed approximately at said first surface of the circuit board to define a plurality of bonding pads;
    a plurality of bonding wires, each including a conductive wire and an electro-insulation coating for covering said conductive wire, for electrically connecting said electrode terminals of the chip to said bonding pads; and
    external connecting terminals at said conductive vias at said second surface of the circuit board,
    wherein connecting portions between said bonding wires and said electrode terminals, and connecting portions between said bonding wires and said bonding pads, are coated with an electro-insulation film,
    wherein said semiconductor chip, said first surface of the second region of the circuit board and said bonding wires are encapsulated by an electro-conductive resin, and
    wherein an electric potential of said electro-conductive resin is set at ground level.

4. A semiconductor device as set forth in claim 3, wherein said circuit board is provided with thermal vias in said first region which directly contact the chip.

5. A semiconductor device as set forth in claim 3, wherein said conductive vias extend over said second surface of the circuit board to define said external terminals.

6. A semiconductor device as set forth in claim 3, wherein said circuit board has ground layers each surrounding an electro-insulation layer, which surrounds each conductive via.

7. A semiconductor device as set forth in claim 6, wherein each of said ground layers is annular-shaped.

8. A semiconductor device as set forth in claim 6, wherein said ground layers are arranged in a grid-like manner.

9. A circuit boards comprising:
   a substrate having a first surface and a second surface opposite to said first surface;
   a plurality of conductive vias arranged in an area-array manner and extending through a thickness direction of said substrate, said conductive vias being exposed approximately at said first surface to define a plurality of bonding pads;
   a semiconductor chip located on the substrate and having electrode terminals;
   a plurality of insulated bonding wires connecting the electrode terminals of the chip to the bonding pads;
   external connecting terminals at said conductive vias at said second surface,
   wherein the chip, connections between said bonding wires and said bonding pads and electrode terminals, and the circuit board, are coated with an electro-insulation film, and
   wherein said semiconductor chip, electro-insulation film, and said insulated bonding wires, are encapsulated by an electro-conductive resin.

10. A circuit board as set forth in claim 9, wherein said conductive vias extend over said second surface of the substrate to define said external terminals.

11. A circuit board as set forth in claim 9, wherein said circuit board has ground layers, each surrounding an electro-insulation layer, which surrounds said conductive via.

12. A circuit board as set forth in claim 11, wherein each of said ground layers is annular-shaped.

13. A circuit board as set forth in claim 11, wherein said ground layers are arranged in a grid-like manner.

* * * * *

UNITED STATES PATENT AND TRADEMARK OFFICE
CERTIFICATE OF CORRECTION

PATENT NO.: 6,084,295
DATED : July 4, 2000
INVENTOR(S): Michio HORIUCHI et al.

It is certified that error appears in the above-identified patent and that said Letters Patent is hereby corrected as shown below:

Col. 2, line 31, after "vias" insert --is--.

Col. 6, line 21, before "conductive" insert --a--.

Col. 7, line 18, after "Fig. 7(b)" insert --is--;
line 26, delete "can".

Signed and Sealed this

Twenty-fourth Day of April, 2001

*Attest:*

NICHOLAS P. GODICI

*Attesting Officer*  *Acting Director of the United States Patent and Trademark Office*